United States Patent
Usui et al.

(10) Patent No.: US 6,953,712 B2
(45) Date of Patent: Oct. 11, 2005

(54) CIRCUIT DEVICE MANUFACTURING METHOD

(75) Inventors: Ryosuke Usui, Aichi (JP); Hideki Mizuhara, Aichi (JP); Yusuke Igarashi, Gunma (JP); Noriaki Sakamoto, Gunma (JP)

(73) Assignees: Sanyo Electric Co., Ltd., Osaka (JP); Kanto Sanyo Semiconductors Co., Ltd., Gunma (JP)

( * ) Notice: Subject to any disclaimer, the term of this patent is extended or adjusted under 35 U.S.C. 154(b) by 0 days.

(21) Appl. No.: 10/724,918

(22) Filed: Dec. 1, 2003

(65) Prior Publication Data

US 2004/0152234 A1 Aug. 5, 2004

(30) Foreign Application Priority Data

Dec. 4, 2002 (JP) .................................... P.2002-352141

(51) Int. Cl.[7] .................... H01L 21/44; H01L 21/48; H01L 21/50
(52) U.S. Cl. ........................ 438/127; 438/617
(58) Field of Search .................. 438/15, 106, 108, 438/118, 121, 169, 200, 597, 612, 689, 690, 702, 778, 780, 790, 613

(56) References Cited

U.S. PATENT DOCUMENTS

| | | | |
|---|---|---|---|
| 3,541,379 A | | 11/1970 | Holden |
| 5,675,177 A | | 10/1997 | Abys et al. |
| 5,807,787 A | * | 9/1998 | Fu et al. ................ 438/623 |
| 5,909,633 A | * | 6/1999 | Haji et al. .............. 438/612 |
| 6,074,895 A | * | 6/2000 | Dery et al. .............. 438/108 |
| 6,083,775 A | | 7/2000 | Huang et al. |
| 6,096,649 A | * | 8/2000 | Jang ...................... 438/687 |
| 6,338,980 B1 | * | 1/2002 | Satoh .................... 438/106 |
| 6,383,893 B1 | * | 5/2002 | Begle et al. ............ 438/460 |
| 6,406,991 B2 | * | 6/2002 | Sugihara ................ 438/613 |
| 6,512,295 B2 | * | 1/2003 | Gaynes et al. .......... 257/738 |
| 6,596,559 B2 | * | 7/2003 | Kodnani et al. ........ 438/106 |
| 6,602,803 B2 | * | 8/2003 | Yew et al. .............. 438/780 |
| 6,689,641 B2 | * | 2/2004 | Ohta et al. .............. 438/121 |
| 6,713,376 B2 | * | 3/2004 | Sugihara ................ 438/613 |
| 6,815,746 B2 | * | 11/2004 | Suzuki et al. .......... 257/296 |
| 2002/0106831 A1 | * | 8/2002 | Tago et al. ............ 438/106 |
| 2004/0006869 A1 | * | 1/2004 | Igarashi et al. ........ 29/847 |
| 2004/0152241 A1 | | 8/2004 | Usui et al. |
| 2004/0234703 A1 | * | 11/2004 | Frautschi .............. 427/535 |

FOREIGN PATENT DOCUMENTS

JP 2002-076246 3/2002

* cited by examiner

Primary Examiner—Olik Chaudhuri
Assistant Examiner—Michael K. Luhrs
(74) Attorney, Agent, or Firm—Fish & Richardson P.C.

(57) ABSTRACT

A circuit device manufacturing method is provided, wherein the adhesion of an overcoat resin, formed on a conductive wiring layer, to a sealing resin layer is improved by irradiating plasma onto the overcoat resin. A first conductive film 23A and a second conductive film 23B, which are laminated with an interlayer insulating layer 22 interposed in between, are formed. By selectively removing the first conductive film, a first conductive wiring layer 12A is formed and the first conductive wiring layer is covered with an overcoat resin 18. Overcoat resin 18 is irradiated with plasma to roughen its top surface. A sealing resin layer 17 is formed so as to cover the top surface of the roughened overcoat resin 18 and circuit elements 13.

13 Claims, 8 Drawing Sheets

CIRCUIT DEVICE MANUFACTURING METHOD

DETAILED DESCRIPTION OF THE INVENTION

1. Field of the Invention

This invention relates to a circuit device manufacturing method, and particularly relates to a circuit device manufacturing method with which the adhesion of the component elements of a circuit device to each other is improved using plasma.

2. Description of the Related Art

With the progress of employment of IC packages in portable equipment and compact, high-density-mounting equipment, the concepts of mounting are changing greatly from those of conventional IC packages. There is an art concerning a semiconductor device employing a polyimide resin sheet, which is a flexible sheet, as an example of an insulating resin sheet.

FIG. 13 shows a semiconductor device using a flexible sheet 50 as an interposer substrate. FIG. 13(A) is a plan view of this semiconductor device and FIG. 13(B) is a sectional view along line A—A of FIG. 13(B). A method of manufacturing this semiconductor device shall now be described.

First, copper foil patterns 51 are prepared and adhered via an adhesive agent onto flexible sheet 50. Copper foil patterns 51 comprises bonding pads 51A and islands 51B. Number and shape of foil patterns 51 depend on the variety of the element mounted thereon.

The symbol 52 indicates openings for leading out electrodes from the rear surface of flexible sheet 50 and at these openings, the copper patterns 51 are exposed. Flexible sheet 50 is then conveyed to a die bonder and semiconductor elements 53 are mounted. Thereafter, this flexible sheet 50 is conveyed to a wire bonder and bonding pads 51A are electrically connected with the pads of semiconductor elements 53 by metal wires 54.

Lastly, sealing is carried out by providing a sealing resin layer 55 on the top surface of flexible sheet 50 as shown FIG. 13(A). Here, transfer molding is performed so as to cover bonding pads 51A, islands 51B, semiconductor elements 53, and metal wires 54. Thereafter, soft solders, solder balls, or other connection means 56 are provided as shown in FIG. 13(B), and by passage through a solder reflow furnace, spherical solders 56, which are fused with bonding pads 51A via openings 52, are formed. Thereafter, since semiconductor elements 53 are formed in matrix form on flexible sheet 50, dicing is performed for separation into individual devices.

However, the semiconductor device manufacturing method described with reference to FIG. 13 had several problems due to the employment of flexible sheet 50. That is, since flexible sheet 50 itself is of some thickness, there was a limit as to how thin a device could be made. In addition, cracks formed in flexible sheet 50 and flexible sheet 50 became warped in the manufacturing process.

In order to resolve such problems as the above, a thin circuit device, with which an interposer substrate, such as flexible sheet 50, etc., is made unnecessary, and a method of manufacturing such a circuit device have been proposed.

Such a circuit device 60 shall now be described in outline with reference to FIG. 14. This circuit device 60 is configured without a flexible sheet or other interposer. By etching conductive films adhered in sheet-like form onto the top and rear of an insulating resin 62, a multilayer wiring structure, comprising a first conductive wiring layer 63 and a second conductive wiring layer 64, is realized. First conductive wiring layer 63 and second conductive wiring layer 64 are insulated by an interlayer insulating layer 62 and are electrically connected at desired locations by multilayer connection means 72. Also, external electrodes 74 are formed at desired locations of second conductive wiring layer 64, and these become the electrodes for connection with a mounted substrate, etc. On top of first conductive wiring layer 63, an overcoat resin 76 is coated at locations besides locations that are to become pads, a semiconductor element 67 is affixed via an insulating adhesive agent 68, and the electrodes of semiconductor element 67 are electrically connected with first conductive wiring layer 63 by means of metal wires 71. Sealing resin layer 73 has the function of sealing semiconductor elements 67 and metal wires 71 and mechanically supporting the entirety.

The above-described circuit device 60 is configured without a flexible sheet or other interposer and has the merit that the overall device is thereby made thin, etc.

As an art for removing contaminants attached to the top surfaces of patterns formed of metal, there is the art of plasma irradiation. A method of irradiating plasma onto a lead frame, on which a semiconductor element is mounted, to remove contaminants attached to the top surface shall now be described with reference to FIG. 15.

The configuration of a lead frame 110, which has been subject to a lead frame processing step, an element mounting step, etc., shall now be described with reference to FIG. 15(A). A semiconductor element 112 is mounted onto an island 114, which has been formed to a land form, and a plurality of leads 111 are disposed so as to surround island 114. Leads 111 correspond to electrodes provided on the top surface of semiconductor element 112 and the respective electrodes are electrically connected via metal wires 113 to leads.

The plasma irradiation step shall now be described with reference to FIG. 15(B). First, lead frame 110 is set in a sealed container. Gas is then introduced into the container and plasma gas is generated by a discharge. The top surface of lead frame 110 is cleaned by the collision of radicals or ions existing in the plasma gas with the top surface of lead frame 110.

However, with the above-described circuit device 60, the adhesion of overcoat resin 76 to sealing resin layer 73 is not adequate and cracks form at the interface of the two components due to the thermal stress arising from temperature changes under usage conditions. There are also problems of entry of moisture, etc., contained in external air, into the circuit device from the interface between overcoat resin 76 and sealing resin layer 73.

Also, with the method of cleaning a lead frame by plasma irradiation as shown in FIG. 15, since complex shapes are formed so as to form island 114 and leads 111, the plasma irradiation causes localized increases in electric potential to occur in lead frame 110. There was thus the problem of current flowing into semiconductor element 112 via metal wires 113 due to such localized potential differences in the lead frame and damaging a CMOS and other elements formed on the top surface of the semiconductor element. There was also the problem that, due to lead frame 110 becoming high in temperature in the plasma irradiation step, the leads become deformed and metal wires 113 become disconnected.

This embodiment of the invention has been made in view of such problems, and a main object of this embodiment of the invention is to provide a circuit device manufacturing method, with which the adhesion force among the elements making up a circuit device is improved by the use of plasma irradiation.

SUMMARY OF THE INVENTION

This embodiment of the invention provides a circuit device manufacturing method comprising the steps of: forming conductive films that are laminated in multiple layers with interlayer insulating layers interposed in between; forming a conductive wiring layer by selective removal of the conductive film at the top surface; forming through holes in the interlayer insulating layers and forming connection means in the through holes to electrically connect the conductive wiring layer with the conductive film at the rear surface; affixing and electrically connecting circuit elements to the conductive wiring layer; irradiating plasma onto the conductive wiring layer, including the circuit elements; and forming a resin layer so as to cover the circuit elements. By roughening the conductive wiring layer by plasma irradiation, the adhesion of the conductive wiring layer to the resin member can be improved.

Furthermore, in the case where a resin is formed on top of the conductive wiring layer, by roughening the resin, the adhesion of the resin layer to the resin can be improved. Also, since the conductive wiring layer is electrically connected, the voltage that is charged up in the resin due to plasma irradiation is released to the exterior via the conductive wiring layer and the conductive film. Since the generation of localized electric potential differences in the plasma irradiation step can thus be restrained, the breakage of semiconductor elements and other circuit elements can be restrained.

With this embodiment, the adhesion force among elements that constitute circuit device is improved by the use of plasma irradiation, thereby enabling the reliability of the circuit device to be improved.

DETAILED DESCRIPTION OF THE PREFERRED EMBODIMENTS

Figure 1:
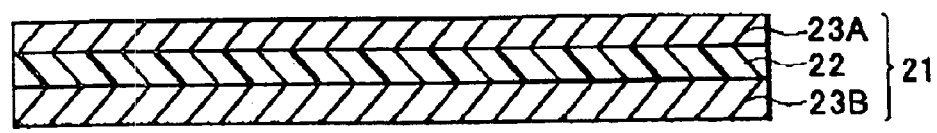
FIG. 1 is a sectional view showing a circuit device manufacturing method of preferred embodiment.

A circuit device manufacturing method of preferred embodiment comprises the steps of: forming conductive films 23 that are laminated in multiple layers with interlayer insulating layers 22 interposed in between; forming a conductive wiring layer 12 by selective removal of conductive film 23 at the top surface; forming through holes 31 in interlayer insulating layers 22 and forming connection means 14 in through holes 31 to electrically connect conductive wiring layer 12 with conductive film 23 at the rear surface; affixing and electrically connecting circuit elements 13 to conductive wiring layer 12 at the rear surface; irradiating plasma onto conductive wiring layer 12, including circuit elements 13; and forming a sealing resin layer 17 so as to cover circuit elements 13. These respective steps shall now be described.

Figure 2:
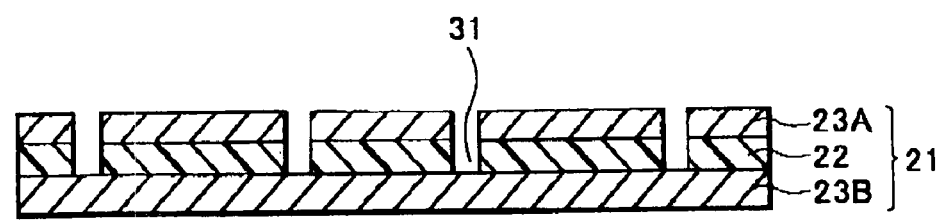
FIG. 2 is a sectional view showing a circuit device manufacturing method of preferred embodiment.
Figure 3:
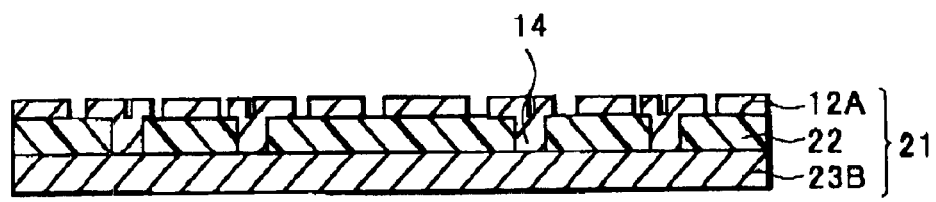
FIG. 3 is a sectional view showing a circuit device manufacturing method of preferred embodiment.

In the first step of this embodiment, conductive films 23 that are laminated in multiple layers with an interlayer insulating layer 22 interposed in between are prepared, a conductive film 23 is removed selectively to form a conductive wiring layer 12, and through holes 31 are formed in interlayer insulating layer 22 and connection means 14 are formed in through holes 31 to electrically connect conductive wiring layer 12 with conductive film 23 as shown in FIG. 1 to FIG. 3.

In this step, first, an insulating sheet 21 is prepared in which a first conductive film 23A and a second conductive film 23B are laminated with an interlayer insulating layer 22 interposed in between. Here, a glass epoxy resin, a resin type resin, or a liquid crystal polymer may be cited as an example of the material of interlayer insulating layer 22. First conductive film 23A is formed across practically the entirety of the top surface of insulating sheet 21 and second conductive film 23B is formed across practically the entirety of the rear surface. A thermoplastic resin or a thermosetting resin may be used as the material of interlayer insulating layer 22. Also, first conductive film 23A and second conductive film 23B are preferably formed of Cu as the principal material or of a known lead frame material and are coated onto interlayer insulating layer 22 by a plating method, vapor deposition method, or sputter method or are adhered as metal foils formed by a rolling method or plating method. Insulating sheet 21 may also be formed by a casting method. To briefly describe a method of manufacture thereof, first a paste-form insulating resin is coated onto first conductive film 23A, having the form of a flat film, and the paste-form insulating resin is also coated onto second conductive film 23B, having the form of a flat film. Insulating sheet 21 is then prepared by adhering these two parts together after semi-curing of the resin.

In the case of the casting method in which a sheet is formed upon coating of a paste-like substance, the film thickness of the sheet will be approximately 10 $\mu$m to 100 $\mu$m. In the case of forming as a sheet, the minimum film thickness of a commercially available product is 25 $\mu$m. A filler may be mixed inside in consideration of thermal conductivity. Glass, Si oxide, aluminum oxide, Al nitride, Si carbide, boron nitride, etc., may be considered as materials of the filler.

Next, through holes 31 are formed in first conductive film 23A and interlayer insulating layer 22 at desired locations of insulating sheet 21, and second conductive film 23B is selectively exposed as shown in FIG. 2. Specifically, the entire surface of first conductive film 23A is coated with a photoresist while leaving exposed the parts at which thorough holes 31 are to be formed. First conductive film 23A is then etched via the photoresist. Since first conductive film 23A is formed of Cu as the principal material, chemical etching is performed using an etching solution of ferric chloride or cupric chloride. Though the opening diameter of through holes 31 will vary according to the resolution of photolithography, it is approximately 50 to 100 $\mu$m here. In the etching process, second conductive film 23B is covered with an adhesive sheet, etc., and protected from the etching solution. However, if second conductive film 23B itself is adequately thick and is of a film thickness with which flatness can be maintained after etching, it may be etched slightly.

After then removing the photoresist, first conductive film 23A is used as a mask to remove interlayer insulating layer 22 at parts immediately below through holes 31 by means of a laser and expose second conductive film 23B at the bottoms of through holes 31. A carbon dioxide laser is preferable as the laser. Also, if after vaporization of the insulating resin by laser, there are residues at the bottom parts of the openings, wet etching using sodium permanganate, ammonium persulfate, etc., is performed to remove the residues.

Referring now to FIG. 3, a plating film, which becomes the multilayer connection means 14 for electrically connecting second conductive film 23B with first conductive film 23A, is formed over the entire surface of first conductive film 23A, including through holes 31. This plating film is formed by both electroless plating and electrolytic plating, and here, a Cu layer is formed to a thickness of approximately 2 $\mu$m over the entire surface of first conductive film 23A, including through holes 31, by electroless plating. Since first conductive film 23A and second conductive film 23B are thereby made electrically continuous, electrolytic plating is performed using first and second conductive films 23A and 23B as electrodes to plate approximately 20 $\mu$m of Cu again. Through holes 31 are thereby filled with Cu and multilayer connection means 14 are formed. Also, though Cu is employed here for the plating film, Au, Ag, or Pd, etc., may be employed instead. Also, partial plating may be performed using a mask.

Figure 11:
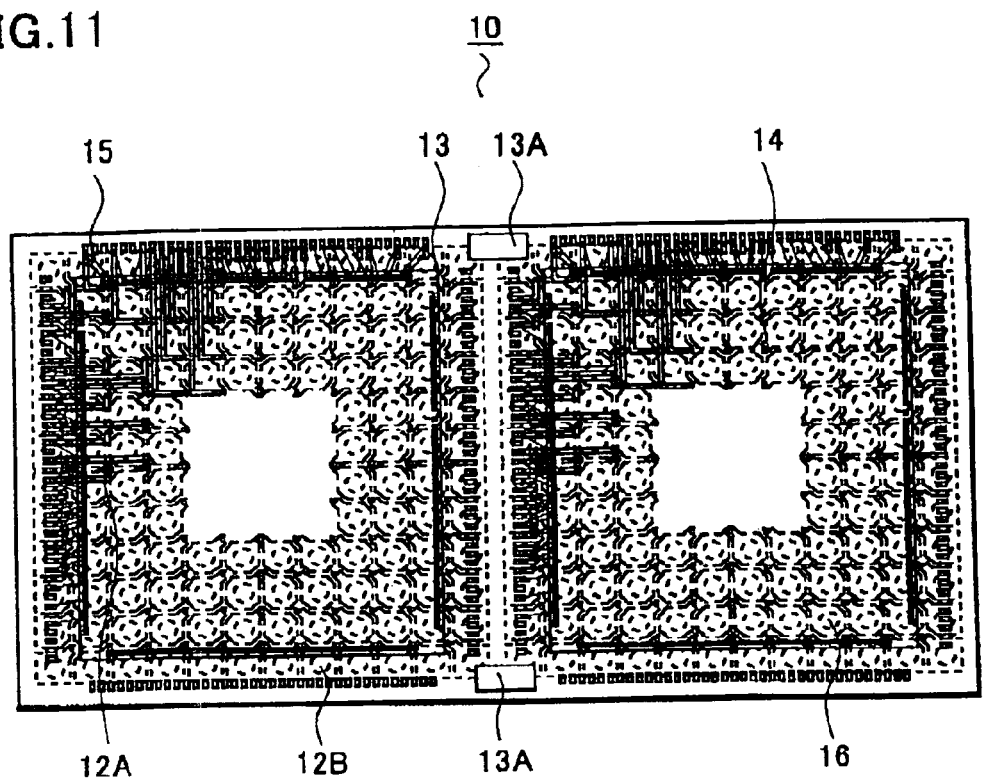
FIG. 11 is a plan view showing a circuit device manufacturing method of preferred embodiment.

First conductive wiring layer 12A is then formed by etching first conductive film 23A in desired patterns as shown in FIG. 3. First conductive film 23A is covered with a photoresist with the desired patterns, and in the case of forming wiring such as shown in FIG. 11, bonding pad parts and first conductive wiring layer 12A parts that extend to the center from the bonding pad parts are formed by chemical etching. Since first conductive film 23A is formed of Cu as the principal material, chemical etching is performed using an etching solution of ferric chloride or cupric chloride.

Figure 4:
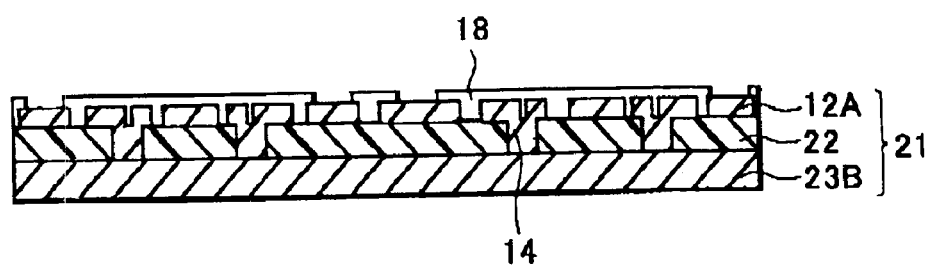
FIG. 4 is a sectional view showing a circuit device manufacturing method of preferred embodiment.
Figure 5:
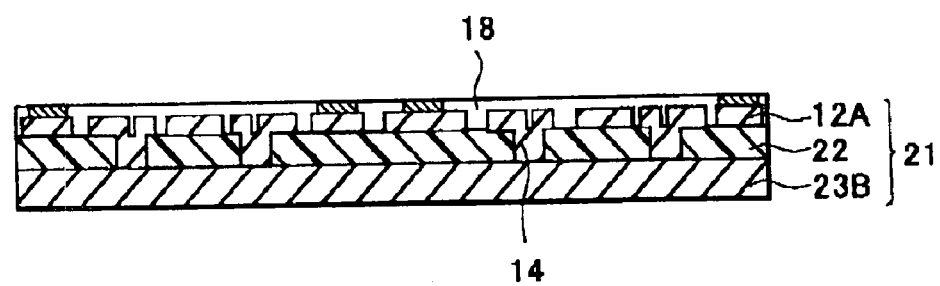
FIG. 5 is a sectional view showing a circuit device manufacturing method of preferred embodiment.

In the second step of this embodiment, conductive wiring layer 12 at the top surface is covered with an overcoat resin 18 while leaving exposed locations that are to become pads as shown in FIG. 4 and FIG. 5. Referring now to FIG. 4, as overcoat resin 18, an epoxy resin, etc., dissolved in a solvent is coated on by screen printing and heat cured. Or, a dry film formed of resin is adhered. A thermosetting resin or a thermoplastic resin may be used as the resin to be used here. A photosensitive resin or a non-photosensitive resin may also be used as the material of overcoat resin 18.

Furthermore, in order to expose the conductive wiring layer at locations that are to become bonding pads, the overcoat resin is partially removed at parts above these locations.

A plating film of Au or Ag, etc., is formed in consideration of the bonding property above the bonding pads as shown in FIG. 5. This plating film is deposited selectively onto the bonding pad parts by electroless plating using overcoat resin 18 as a mask or is deposited by electrolytic plating using second conductive film 23B as an electrode.

Figure 6:
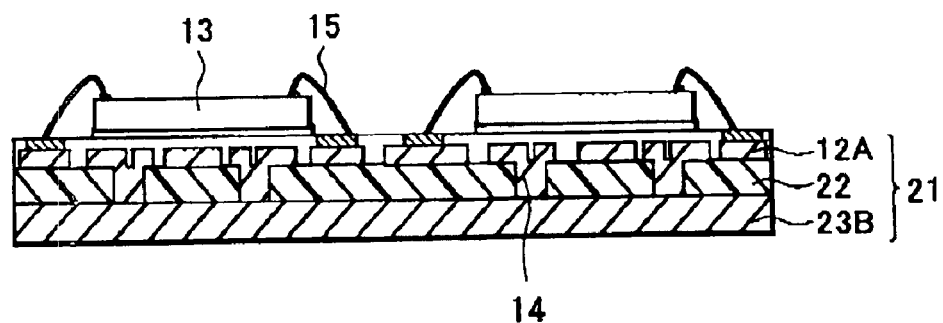
FIG. 6 is a sectional view showing a circuit device manufacturing method of preferred embodiment.

In the third step of this embodiment, circuit elements 13 are affixed onto overcoat resin 18 and electrically connected with conductive wiring layer 12 as shown in FIG. 6.

Here, circuit elements 13 are semiconductor elements and are die bonded in the form of bare chips onto overcoat resin 18 by an insulating adhesive resin, etc. Since circuit elements 13 are electrically insulated from the first conductive wiring layer 12A parts immediately below by overcoat resin 18, first conductive wiring layer 12A can be wired freely even below circuit elements 13 to realize a multilayer wiring structure.

The respective electrode pads of circuit elements 13 are connected to bonding pads, which are parts of first conductive wiring layer 12A that are disposed at the periphery, by means of metal wires 15. Here, circuit elements 13 may be mounted in a face-down manner. In this case, solder balls and bumps are formed on the top surfaces of the respective electrode pads and electrodes equivalent to bonding pads are provided at parts of the top surface of first conductive wiring layer 12A that correspond to the positions of the solder balls.

Figure 7A:
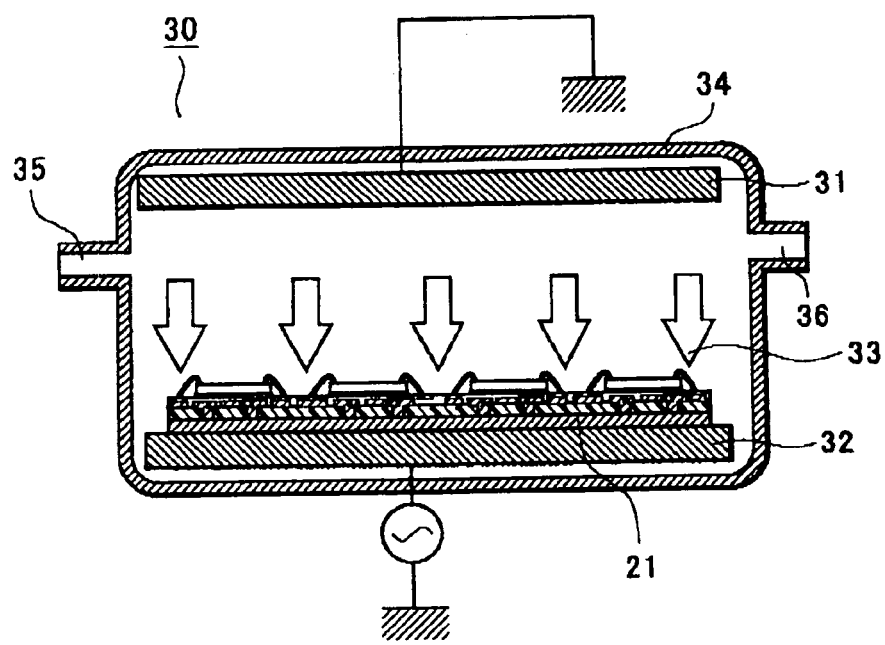
FIG. 7 is a sectional view (A) and a sectional view (B) showing a circuit device manufacturing method of preferred embodiment.
Figure 7B:
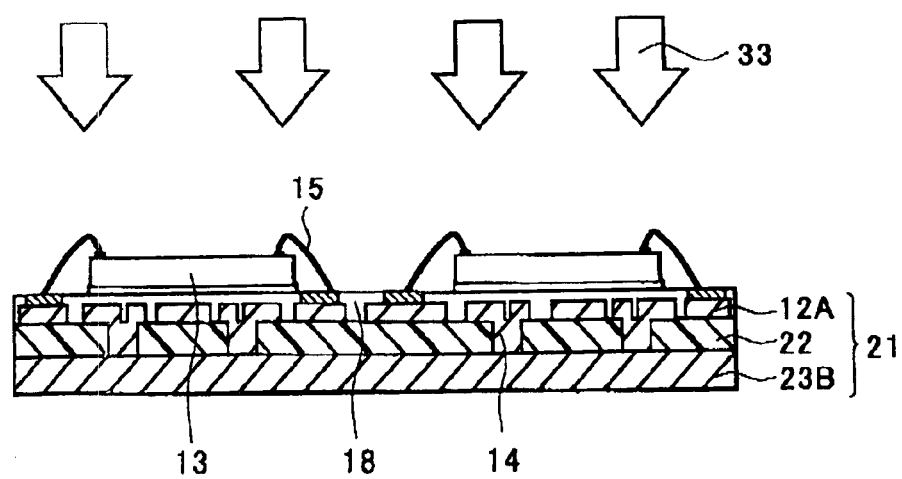

In the fourth step of this embodiment, plasma is irradiated onto the top surface of overcoat resin 18, including circuit elements 13, to roughen the top surface of overcoat resin 18 while the voltage, which is charged up in overcoat resin 18, is released from conductive wiring layer 12 via conductive film 23 as shown in FIG. 7. FIG. 7(A) is a diagram showing the plasma cleaning process in outline, and FIG. 7(B) is a sectional view showing the manner in which plasma is irradiated onto a single mounting part 15.

As shown in FIG. 7(A), a plasma cleaner 30 has an upper electrode 31, which is disposed inside a sealed container 34, and a lower electrode 31, which is disposed opposite upper electrode 31 and on top of which insulating sheet 21 is placed. An inlet 35 for supplying gas into the container and an outlet 36 for exhaust the gas are also provided. One of either upper electrode 31 or lower electrode 32 is connected to a high-frequency power supply and the electrode that is not connected to the power supply is grounded.

For plasma cleaning for removal of contaminants on the top surface of the conductive foil, there are the two types of methods of chemical etching and physical etching. Chemical etching methods include the DP (Direct Plasma) and PE (Plasma Etching) methods and oxygen may be used as the gas. Physical-chemical etching methods include the RIE (Reactive Ion Etching) method and an inert gas, such as argon, neon, or helium, may be used as the gas. With chemical etching, organic contaminants can be removed and the top surface can be roughened by the use of chemical effects, and with physical etching, organic and inorganic contaminants can be removed and the top surface can be roughened by the sputter effect. Either type of method may be used with the present embodiment. Plasma irradiation using ozone may also be performed.

The details of surface roughening by plasma shall now be described with reference to FIG. 7(B). With this embodiment, plasma is irradiated across the entirety of insulating sheet 21. Specifically, the ions in a plasma 33, generated by discharge, are made to collide over the entirety of the top surface of insulating sheet 21. Ions thus collide with overcoat resin 18, circuit elements 13, and metal wires 15 and microscopic indentations and protrusions are formed on the surfaces of these parts. Thereby, these surfaces are roughened. The organic or inorganic contaminants attached to these surfaces are also removed.

Also, first conductive wiring layer 12A is electrically integral to second conductive film 23B, which is the lowermost layer. Thus even when subject to the influence of plasma, the voltage that is generated by charges accumulating in overcoat resin 18 is released to the exterior via first conductive wiring layer 12A and the second conductive film. Thus even if a circuit element 13 is a CMOS, etc., which undergoes voltage breakdown readily, the damage to circuit element 13 can be restrained to the minimum.

In the case where plasma irradiation by RIE using argon is to be performed, the ion energy of argon is set to be in the range of 40 eV to 100 eV. By doing so, matter attached to surfaces can be removed and appropriate roughening and cleaning of the surfaces can be performed.

Furthermore, plasma irradiation can be performed by combining the DP and RIE. In this case, after performing DP using oxygen gas, RIE using an inert gas is performed. By doing so, the oxide film that is formed on surfaces by the performing of DP can be removed appropriately by RIE.

Insulating sheet 21 is mechanically supported by second conductive film 23B, which is the lowermost layer. Thus even if insulating sheet 21 is heated in this step, since insulating sheet 21 will undergo thermal expansion uniformly, localized thermal expansion or deformation of first conductive wiring layer 12A will be prevented. Bending and cutting of metal wires 15 due to expansion or deformation of first conductive wiring layer 12A can thus be restrained.

The merits of performing plasma irradiation in the state in which first conductive wiring layer 12A is covered with overcoat resin 18 shall now be described. First conductive wiring layer 12A is covered with overcoat resin 18 even at its corner parts. The generation of sparks from corner parts of first conductive wiring layer 12A when plasma irradiation is performed can thus be prevented. Vaporization of copper, which is the material of conductive wiring layer 12A due to concentration of sparks can thus be prevented. The contamination of the interior of plasma cleaner 30 by vaporized material can also be prevented.

In the fifth step of this embodiment, a sealing resin layer 17 is formed so as to cover the top surfaces of circuit elements 13 and overcoat resin 18 as shown in FIG. 18.

Resin molding is performed upon setting insulating sheet 21 in a mold apparatus. Transfer molding, injection molding, coating, dipping, etc., maybe carried out as the molding method. With this embodiment, resin sealing is carried out by transfer molding using a thermoplastic resin. Since the top surface of overcoat resin 18 is roughened in the prior step, the adhesion of the top surface of overcoat resin 18 to sealing resin layer 17 is improved.

Figure 8A:
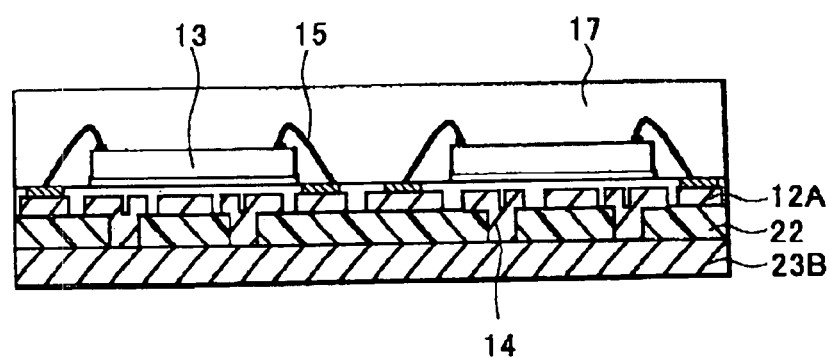
FIG. 8 is a sectional view (A) and a plan view (B) showing a circuit device manufacturing method of preferred embodiment.

As shown in FIG. 8(A), insulating sheet 21 must be put in flat contact with the lower die of the mold cavity in the present step, and the thick second conductive film 23B provides this effect. In addition, even after being taken out from the mold cavity, the flatness of the package is maintained by second conductive film 23B until the shrinkage of sealing resin layer 17 stops completely. The role of mechanical support of insulating sheet 21 is thus served by second conductive film 23B until this step.

Figure 8B:
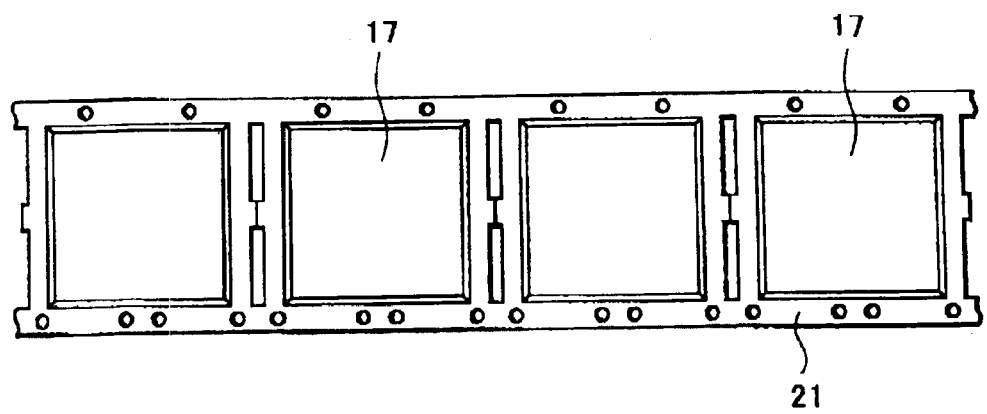

Furthermore in this step, blocks, in each of which a plurality of circuit elements 13 are affixed in matrix form, are formed on insulating sheet 21 and such a block is subject to unified molding in a single molding die as shown in FIG. 8(B). In this figure, a plurality of (four, in the present case) blocks are disposed in a spaced manner in a single insulating sheet 21, and each block is resin sealed by a single sealing resin layer 17. A plurality of circuit devices can thus be molded using a single die, thus enabling elimination of the cost of preparing dies anew in accordance with the sizes and shapes of the circuit devices to be manufactured and reduction of the amount of resin used.

Figure 9:
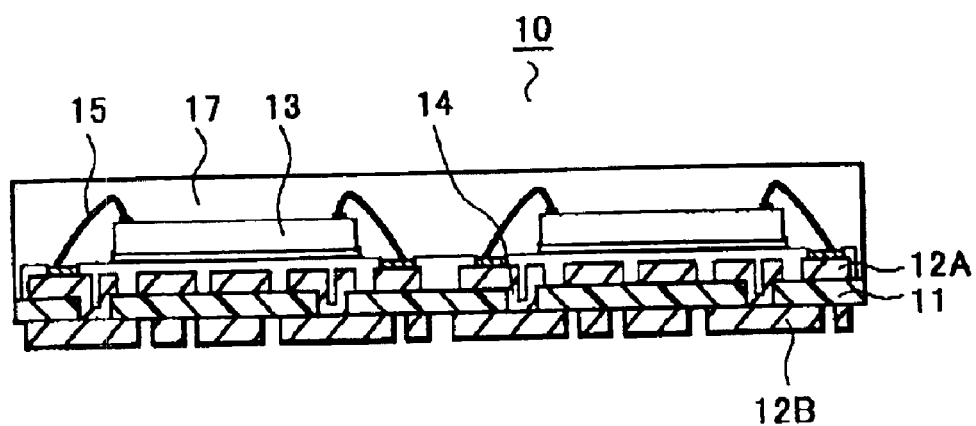
FIG. 9 is a sectional view showing a circuit device manufacturing method of preferred embodiment.

In the sixth step of this embodiment, a second conductive wiring layer 12B is formed by selectively removing conductive film 23B as shown in FIG. 9.

Second conductive film 23B is covered with a photoresist with desired patterns to form second conductive wiring layer 12B by chemical etching. For example, second conductive wiring layer 12B are aligned at fixed intervals as shown in FIG. 11 and each part is electrically connected via multilayer connection means 14 to first conductive wiring layer 12A to realize a multilayer wiring structure.

A large part of second conductive wiring layer 15 is then covered with an overcoat resin 18 by screen printing an epoxy resin, etc., dissolved in a solvent, while leaving exposed the parts at which external electrodes 16 are to be formed. Then by solder reflow, external electrodes 16 are formed simultaneously at the exposed parts. Lastly, since a plurality of circuit devices are formed in a matrix form in insulating sheet 21, sealing resin layer 17 and insulating sheet 21 are diced to perform separation into the individual circuit devices.

Second conductive film 23B may also be removed in an overall manner. In this case, multilayer connection means 14 are exposed from the rear surface of interlayer insulating layer 11 and the external electrodes are formed at the exposed multilayer connection means 14.

Figure 10:
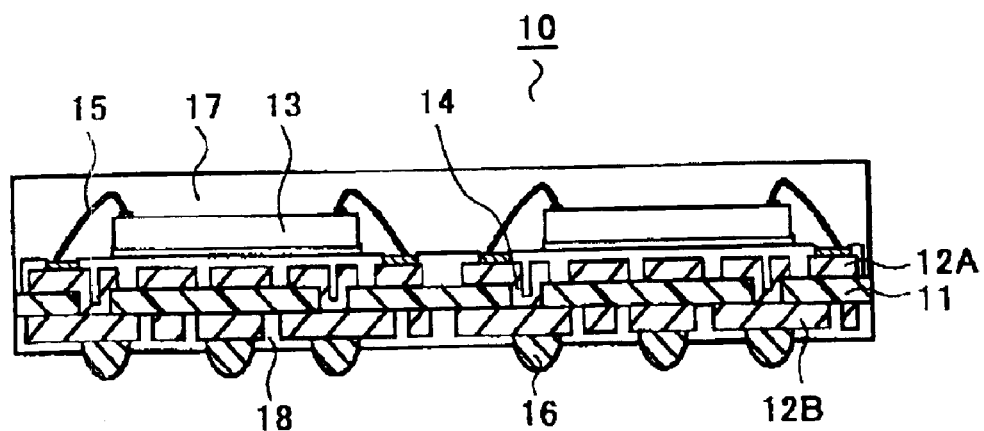
FIG. 10 is a sectional view showing a circuit device manufacturing method of preferred embodiment.

The configuration of a circuit device 10 manufactured by the above-described steps shall now be described with reference to FIG. 10 and FIG. 11. Circuit device 10 has an configuration comprising: first conductive wiring layer 12A and second conductive wiring layer 12B, which are laminated with interlayer insulating layer 11 interposed in between; overcoat resin 18, which covers the first conductive wiring layer 12A; circuit elements 13, which are affixed onto overcoat resin 18 and are electrically connected to first conductive wiring layer 12A; sealing resin layer 17, which covers circuit elements 13; multilayer connection means 14, which pass through interlayer insulating layer 11 at desired locations and connect the conductive wiring layers 12 to each other; and external electrodes 16, provided at desired locations of second conductive wiring layer 12B. These components shall now be described.

First conductive wiring layer 12A and second conductive wiring layer 12B are formed by etching the conductive films formed on the top and rear of interlayer insulating layer 11. The conductive films are formed of a material having Cu as the principal material or of a known lead frame material and may be coated onto interlayer insulating layer 11 by a plating method, vapor deposition method, or sputter method or are adhered as metal foils formed by a rolling method or plating method. Also, first conductive wiring layer 12A and second conductive wiring layer 12B are covered by overcoat resin 18.

Interlayer insulating layer 11 has a function of insulating first conductive wiring layer 12A and second conductive wiring layer 12B and is disposed as a layer between the two conductive wiring layers 12. As the material of interlayer insulating layer 11, a thermoplastic resin or thermosetting resin with the characteristic of softening at a high temperature is employed.

Overcoat resin 18 is formed of a thermosetting resin or a thermoplastic resin and covers a large part of first conductive wiring layer 12A. At locations that are to be pads for connection with circuit elements 13, overcoat resin 18 is partially removed and a plating film is formed. Here, the top surface of overcoat resin 13 is roughened in the above-described step of performing plasma irradiation to realize firm adhesion of the roughened top surface of overcoat resin 18 to sealing resin layer 17.

Circuit elements 13 are affixed onto first conductive wiring layer 12A via an insulating adhesive agent, etc., and are electrically connected to first conductive wiring layer 12A via metal wires 15. In the present embodiment, two semiconductor elements are affixed as circuit elements 13. Circuit elements besides semiconductor elements may be employed as circuit elements 13, and chip capacitors, chip resistors, transistor chips, etc., may also be employed as circuit elements 13.

Multilayer connection means 14 pass through interlayer insulating layer 11 and connect first conductive wiring layer 12A and second conductive wiring layer 12B at desired locations. Specifically, a copper plating film is suited as multilayer wiring means 14. A plating film of gold, silver, or palladium, etc., may also be used.

Sealing resin layer 17 covers first conductive wiring layer 12A and circuit elements 13. This sealing resin layer 17 also serves the function of mechanically supporting the entirety of the completed circuit device. Sealing resin layer 17 is formed of a thermosetting resin that is formed by transfer molding.

External electrodes 16 are provided at desired locations of second conductive wiring layer 12B. That is, a large part of second conductive wiring layer 12B is covered by overcoat resin 18 and external electrodes 16, formed of soft solder or other solder material, are disposed at the exposed parts of second conductive wiring layer 12B.

An example of the planar structure of circuit device 10 shall now be described with reference to FIG. 11. The patterns indicated by solid lines are patterns of first conductive wiring layer 12A and the patterns indicated by dotted lines are patterns of second conductive wiring layer 12B. First conductive wiring layer 12A forms bonding pads that surround circuit elements 13 and is disposed in two stages at parts to accommodate for circuit elements 13 having multiple pads. First conductive wiring layer 12A is connected by metal wires 15 to electrode pads corresponding to circuit elements 13, and a plurality of parts of first conductive wiring layer 12A that are formed to fine patterns extend below circuit elements 13 and are connected via multilayer connection means 14, indicated by solid circles, to second conductive wiring layer 12B.

With this structure, even for a semiconductor element having 200 or more pads, fine patterns of first conductive wiring layer 12A can be used for extension via the multilayer wiring structure to desired parts of second conductive wiring layer 12B and connection to external circuits can be made from external electrodes disposed at second conductive wiring layer 12B.

As shown in the same figure, circuit elements 13A are mounted to first conductive wiring layer 12A at peripheral parts. Here, a chip resistor, chip capacitor, or other passive part or a bare transistor chip, diode, or other active part may be employed as circuit element 13A. By mounting circuit elements 13A at the outermost peripheral parts, the mounting density of the device as a whole can be improved.

Figure 12:
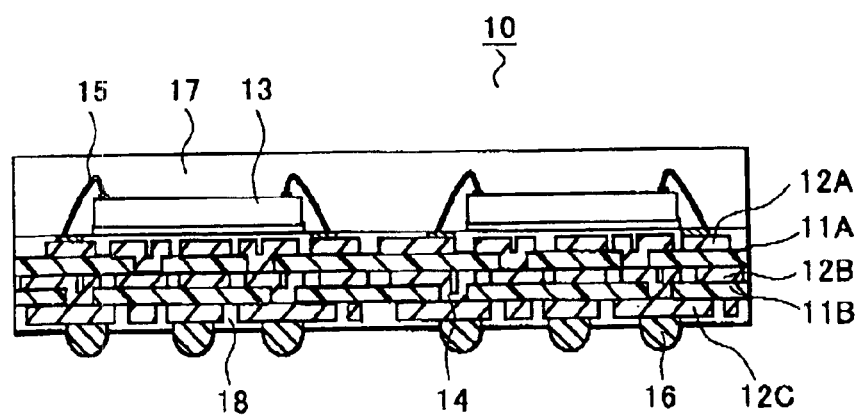
FIG. 12 is a sectional view showing a circuit device manufacturing method of preferred embodiment.
Figure 13A:
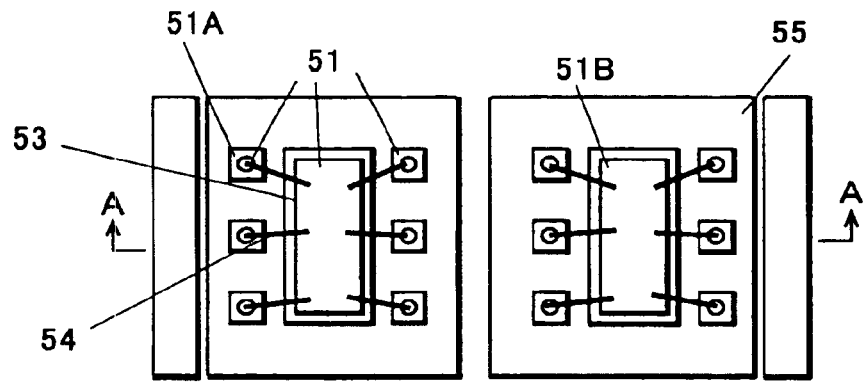
FIG. 13 is a plan view (A) and a sectional view (B) showing a related-art circuit device manufacturing method.
Figure 13B:
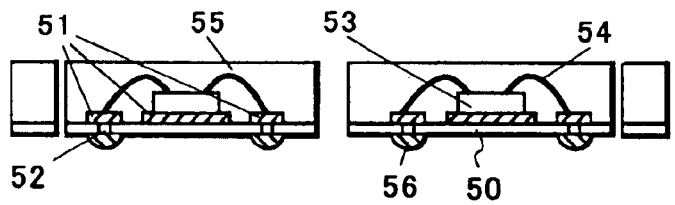
Figure 14:
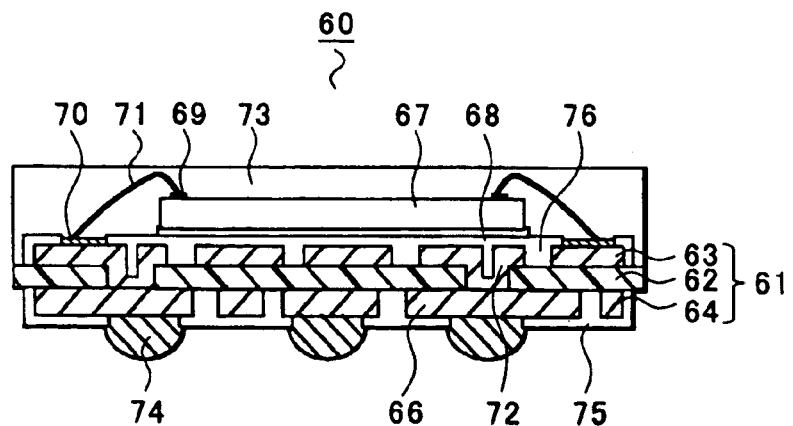
FIG. 14 is a sectional view showing a related-art circuit device manufacturing method.
Figure 15A:
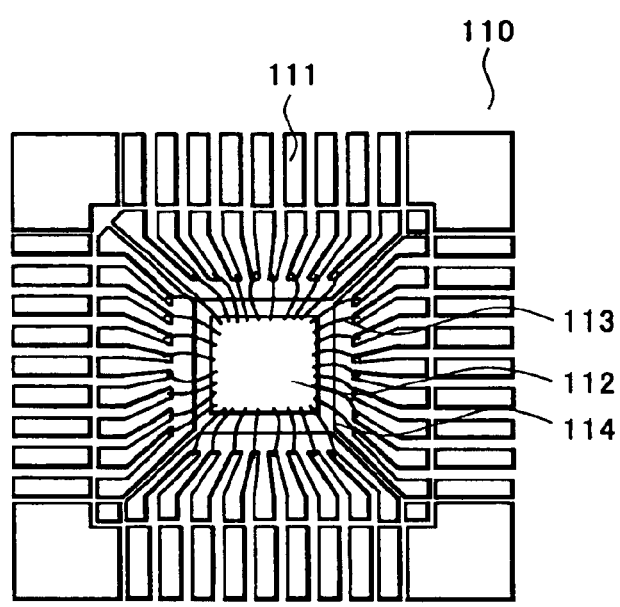
FIG. 15 is a plan view (A) and a sectional view (B) showing a related-art circuit device manufacturing method.
Figure 15B:
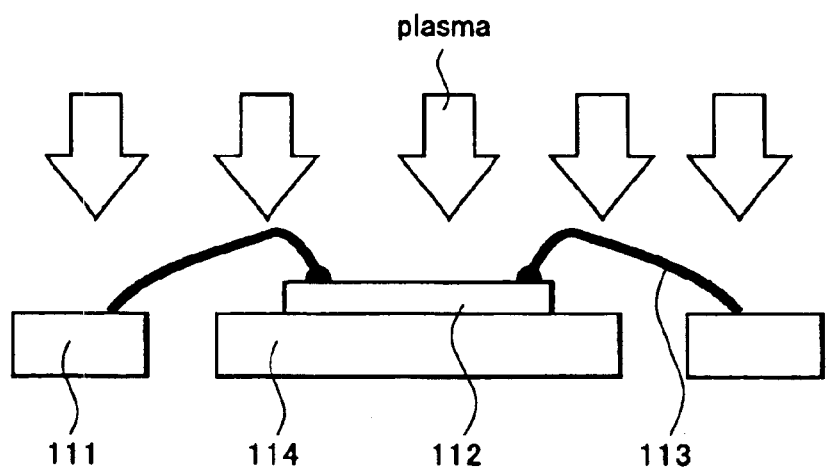

The configuration of a circuit device 10 with a three-layer wiring structure shall now be described with reference to FIG. 12. The basic configuration of the circuit device described with reference to this figure is the same as that described with reference to FIG. 10, and the difference lies in conductive wiring layers 12. Here, a three-layer structure, comprising a first conductive wiring layer 12A, a second conductive wiring layer 12B, and a third conductive wiring layer 12C, is formed. A large part of first conductive wiring layer 12A, which forms the conductive patterns of the uppermost layer, is covered by an overcoat resin 18. By the top surface of overcoat resin 18 being subject to plasma treatment, the top surface is made a rough surface and the adhesion of overcoat resin 18 to sealing resin layer 17 is thereby improved.

With this circuit device manufacturing method of embodiment, since plasma cleaning is performed with conductive wiring layers 12 of the entirety being made electrically integral by the lowermost layer of conductive film 23, the voltage that is generated in overcoat resin 18 by the influence of plasma can be released to the exterior via the conductive film. Damage to circuit elements 13 due to potential differences that occur as a result of the influence of plasma can thereby be restrained.

Furthermore, since the top surface of overcoat resin 18, which covers conductive wiring layer 12, is roughened by plasma irradiation, the adhesion of overcoat resin 18 to sealing resin layer 17 is improved.

Furthermore, since insulation sheet 21, with which conductive wiring layers 12 are formed, is mechanically supported by the lowermost layer of conductive film 23, and the entirety undergoes thermal expansion uniformly even when heated by plasma irradiation, bending and cutting of metal wires 15 due to localized thermal deformation of conductive wiring layers 12 can be prevented.

What is claimed is:

1. A circuit device manufacturing method comprising:
   forming conductive films that are laminated in multiple layers with interlayer insulating layers interposed in between;
   forming a first conductive wiring layer by selective removal of the conductive film at a top surface;
   forming through holes in the interlayer insulating layers and forming connection means in the through holes to electrically connect the first conductive wiring layer with the conductive film at a rear surface;
   affixing a circuit element to the first conductive wiring layer and electrically connecting the circuit element to the first conductive wiring layer via conductive wires;
   irradiating plasma onto the first conductive wiring layer, the circuit element and the conductive wires; and
   forming a resin layer so as to cover the circuit element; and
   forming a second conductive wiring layer by selective removal of the conductive film at the rear surface after the irradiation.

2. The method of claim 1, wherein the conductive wiring layer is covered with resin while exposing locations that are to become pads.

3. The method of claim 2, wherein in the step of irradiating plasma, the plasma is irradiated onto a top surface of the resin as well to roughen the top surface of the resin while a voltage, which is charged up in the resin, is released from the conductive wiring layer and via the conductive films.

4. The method of claim 1, wherein connection means, comprising a plating film, are formed in the through holes to electrically connect the conductive wiring layer and the conductive film.

5. The method of claim 1, wherein the plasma irradiation is carried out using oxygen gas or ozone.

6. The method of claim 1, wherein the plasma irradiation is carried out using an inert gas, such as argon, neon, or helium.

7. The method of claim 6, wherein in the process of irradiating the plasma using argon, ion energy of argon is in a range of 40 eV to 100 eV.

8. The method of claim 1, wherein the plasma irradiation includes using an oxygen gas and wherein, after performing the plasma irradiation using oxygen gas, plasma irradiation using an inert gas, such as argon, neon, or helium, is carried out.

9. The method of claim 1, wherein the conductive film is formed of a metal having copper as a principal material.

10. The method of claim 1, wherein the circuit element is semiconductor element that is electrically connected via metal wires to the conductive wiring layer.

11. The method of claim 1, wherein the circuit element is semiconductor element that is mounted in a face-down manner.

12. The method of claim 11, wherein the circuit element is electrically connected to the conductive wiring layer via soft solder or other solder material.

13. The method of claim 1 wherein the first conductive wiring layer is covered by overcoat resin.

* * * * *